(12) United States Patent
Fu et al.

(10) Patent No.: US 11,868,052 B2
(45) Date of Patent: Jan. 9, 2024

(54) IMMERSION LIQUID SUPPLY AND RECOVERY DEVICE WITH NEW-TYPE PUMPING AND DRAINAGE CAVITIES

(71) Applicant: ZHEJIANG CHEER TECHNOLOGY CO., LTD., Hangzhou (CN)

(72) Inventors: Xin Fu, Hangzhou (CN); Min Wu, Hangzhou (CN); Xiaobo Wang, Hangzhou (CN); Rui Su, Hangzhou (CN); Liang Hu, Hangzhou (CN)

(73) Assignee: ZHEJIANG CHEER TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 17/791,909

(22) PCT Filed: Nov. 5, 2020

(86) PCT No.: PCT/CN2020/126652
§ 371 (c)(1),
(2) Date: Jul. 11, 2022

(87) PCT Pub. No.: WO2021/143302
PCT Pub. Date: Jul. 22, 2021

(65) Prior Publication Data
US 2022/0404715 A1 Dec. 22, 2022

(30) Foreign Application Priority Data

Jan. 17, 2020 (CN) .......................... 202010055888.4

(51) Int. Cl.
*G03F 7/00* (2006.01)
(52) U.S. Cl.
CPC ...... *G03F 7/70341* (2013.01); *G03F 7/70858* (2013.01)

(58) Field of Classification Search
CPC . G03F 7/70341; G03F 7/70858; G03F 7/2041
See application file for complete search history.

(56) References Cited

U.S. PATENT DOCUMENTS 8,654,309 B2 * 2/2014 Kemper .................. F01N 1/023
355/53
8,953,142 B2 * 2/2015 Kemper .............. G03F 7/70341
355/72
(Continued)

FOREIGN PATENT DOCUMENTS

CN  101354539   1/2009
CN  104965392  10/2015
(Continued)

*Primary Examiner* — Hung V Nguyen
(74) *Attorney, Agent, or Firm* — Jiwen Chen; Joywin IP Law PLLC

(57) ABSTRACT

An immersion liquid supply and recovery device (2) with new-type pumping and drainage cavities includes pumping and drainage openings, pumping and drainage cavities, and sealed pumping and drainage channels, wherein the pumping and drainage cavities are in communication with an immersion flow field by means of the multiple pumping and drainage openings, and the pumping and drainage openings in communication with the different pumping and drainage cavities are circumferentially distributed in a crossed manner; at least two pumping and drainage cavities are provided, and each of the pumping and drainage cavities is in communication with an immersion liquid recovery system by one sealed pumping and drainage channel respectively; and the communication points of the pumping and drainage cavities and the sealed pumping and drainage channels are evenly arranged in the circumferential direction of the pumping and drainage cavities.

12 Claims, 4 Drawing Sheets

(56) References Cited

U.S. PATENT DOCUMENTS

| | | | | |
|---|---|---|---|---|
| 9,140,995 B2* | 9/2015 | Riepen | ............... | G03F 7/2041 |
| 9,213,246 B2* | 12/2015 | Kemper | ............... | G03F 7/70341 |
| 10,437,156 B2* | 10/2019 | Kaneko | ............... | G03F 7/7095 |

FOREIGN PATENT DOCUMENTS

| | | |
|---|---|---|
| CN | 105807566 | 7/2016 |
| CN | 107991843 | 5/2018 |
| JP | 2008021718 | 1/2008 |

* cited by examiner (a)　　　　　(b)　　　　　(c)

IMMERSION LIQUID SUPPLY AND RECOVERY DEVICE WITH NEW-TYPE PUMPING AND DRAINAGE CAVITIES

This is a U.S. national stage application of PCT Application No. PCT/CN2020/126652 under 35 U.S.C. 371, filed Nov. 5, 2020 in Chinese, claiming priority of Chinese Application No. 202010055888.4, filed Jan. 17, 2020, all of which are hereby incorporated by reference.

TECHNICAL FIELD OF THE INVENTION

The present invention relates to an immersion liquid supply and recovery device of an immersion lithography apparatus, in particular to an immersion liquid supply and recovery device with novel extraction chambers.

BACKGROUND OF THE INVENTION

A lithography apparatus is one of the core equipment for manufacturing Very Large Scale integration (VLSI) circuits. Modern lithography apparatuses mostly adopt optical lithography and accurately project and expose a pattern on a mask onto a photoresist-coated substrate by an optical system. The lithography apparatus includes a laser source, a projection objective lens system, a projection mask carrying chip patterns, an alignment system, and a photoresist-coated substrate.

Compared with dry lithography apparatuses taking gas as the intermediate medium, immersion lithography apparatuses can increase the numerical aperture (NA) of the projection objective lens by filling liquid with high refractive index into the gap between the last projection objective lens and the substrate to increase the refractive index (n) of the medium in the gap, thus improving the resolution and depth of focus (DOF) of the lithography apparatuses. In the existing mainstream lithography, immersion lithography has received wide attention because of its minimal changes to existing equipment and good inheritance to the existing dry lithography apparatus. At present, a widely used method for filling immersion liquid is partial immersion, i.e., the immersion liquid is confined by an immersion liquid supply and recovery device to a partial area between the lower surface of the last projection objective lens and the upper surface of the substrate. Maintaining the optical consistency and transparency of the immersion liquid in the exposure area is the key to ensure the exposure quality of immersion lithography. To this end, the existing technical solutions usually enable the real-time update of an immersion flow field by supply and recovery immersion liquid, and remove photochemical pollutants, heat and micro-nano bubbles from the core exposure area in time to ensure the high purity and homogeneity of the immersion liquid.

At the same time, in order to effectively maintain and control the complete boundary of the immersion flow field in the gap, the existing devices often adopt the technical solution integrating meniscus confinement with high-pressure gas sealing, i.e., the filled liquid is confined within a certain circular or rhombic flow field area by vacuum extraction and an annular air curtain produced by supplying positive-pressure sealing gas extraction chambers (see, for example, Chinese patent ZL200310120944.4 and U.S. patent US2007046916). However, the immersion liquid extraction chambers are located between the immersion flow field and surrounding gas (naturally flowing atmospheric air, or positive-pressure gas produced by a gas sealing device). In the process of extracting the immersion liquid under negative pressure, gas-liquid two-phase flow will inevitably be formed in the immersion liquid extraction chambers. The unstable gas-liquid two-phase flow, especially when the positive-pressure sealing gas flow is supplied to ensure the effective extraction of the immersion liquid, will aggravate the turbulence of the two-phase flow in the immersion liquid extraction chambers. Moreover, micro-nano bubbles emerge and collapse in the flowing and phase-changing process of the two-phase flow, which will lead to the occurrence and conduction of vibrations that impact the immersion flow field between a terminal element of the projection objective lens and the substrate. The process of phase change will also lead to evaporative cooling of liquid phase in the immersion liquid extraction channel, thus aggravating inhomogeneity of the temperature distribution. Moreover, in an immersion lithography system, the two-phase flow induces the lines to violently vibrate at complex amplitude and frequency, which is difficult to be isolated from the whole system and will affect the exposure quality.

As shown in FIG. 1, an immersion liquid supply and recovery device 2 of an immersion lithography apparatus is provided between a projection objective lens system 1 and a substrate 3. The immersion liquid driven by an immersion liquid supply system 5 is filled by the immersion liquid supply and recovery device 2 into a space between the projection objective lens system 1 and the substrate 3, and extracted by an immersion liquid extraction system 6 through the immersion liquid supply and recovery device 2. The immersion liquid is filled into the space between the projection objective lens system 1 and the substrate 3 to form an immersion flow field 4. The immersion liquid has a refractive index higher than that of air. Compared with a dry lithography apparatus, the immersion lithography apparatus provides the immersion flow field 4 and improves the refractive index of an optical medium between the projection objective lens system 1 and the substrate 3. After passing through the projection objective lens system 1 and the immersion flow field 4, laser beams carrying integrated circuit pattern information may converge more concentratedly and form a smaller integrated circuit pattern on the substrate 3.

As shown in FIGS. 2 and 3, a circular through hole 21 through which laser beams pass is formed in the center of the immersion liquid supply and recovery device 2, and is in a shape of a big-end-up truncated cone fitted to the shape of a lower end face of the projection objective lens system 1. An immersion liquid supply channel 22 and an immersion liquid extraction channel 23 are provided in the immersion liquid supply and recovery device 2. The immersion liquid supplied by the immersion liquid supply system 5 flows through the immersion liquid supply channel 22 into the immersion flow field 4, and is extracted by the immersion liquid extraction system 6 through the immersion liquid extraction channel 23. A gap with a minimum thickness ranging from 0.1 mm to 1 mm is located between the immersion liquid supply and recovery device 2 and the substrate 3. In order to avoid leakage of the immersion liquid from the gap to the surrounding environment, extraction openings 24 with a diameter ranging from 0.2 mm to 2 mm are distributed on a lower end face of the immersion liquid supply and recovery device 2 in the circumferential direction of the circular through hole 21. One end of each extraction opening 24 is communicated with the immersion flow field 4, while the other end thereof is communicated with an extraction channel 25. The extraction chamber 25 is an annular chamber communicated with a plurality of extraction openings 24 and a sealing extraction channel 26. The immersion liquid extraction system 6 applies negative pressure, so that the immersion liquid in the immersion flow field 4 converges into the extraction chamber 25 through the extraction openings 24, and is extracted by the immersion liquid extraction system 6 through the sealing extraction channel 26. Under the extraction action of the immersion liquid extraction system 6, the immersion liquid and surrounding gas form a circle of meniscus 41 near the extraction openings 24. In order to avoid leakage of the immersion liquid from the immersion flow field 4 and contamination caused by residual liquid on the substrate 3, the meniscus 41 needs to be stably controlled in appropriate position and shape.

The material of the substrate is very sensitive to pollutants. In order to ensure that no immersion liquid leaks, the extraction openings 24 has a strong extraction capacity and usually sucks in surrounding gas while extracting the immersion liquid. The surrounding gas may be ambient air, and may also be positive-pressure gas supplied around the immersion flow field 4 by sealing gas supply structures which are provided around the extraction openings 24, so as to seal the meniscus 41 even better. Influenced by the extraction flux of gas and liquid, gas and liquid distribute with certain characteristics, which are called flow patterns of gas-liquid two-phase flow, in the extraction openings 24, the extraction chamber 25 and the sealing extraction channel 26. For example, as shown in FIG. 4, in a circular flow channel, when the flux of gas is less than that of liquid, the gas exists in the form of small bubbles in the liquid, which is called bubble flow, as shown in FIG. 4(a). When the flux of gas is slightly greater than that of liquid, many small bubbles coalesce to form larger bubbles in the shape of bullets, which is called slug flow, as shown in FIG. 4(b). When the flux of gas is even greater than that of liquid, the gas and liquid stratification occurs, with the gas flowing in the vicinity of the axis of the flow channel and the liquid flowing in the vicinity of the wall of the flow channel, which is called annular flow, as shown in FIG. 4(c). The gas-liquid two-phase flows with different flow patterns have different characteristics in vibration and thermodynamics.

In an immersion liquid supply and recovery device 2 shown in FIG. 3, an extraction chamber 25 is communicated with a sealing extraction channel 26. Due to the drag resistance of the fluid flow, the extraction capacity of the extraction opening 24 is weaker the farther away from the connection point, so the immersion liquid supply and recovery device 2 has a weaker confinement to the distal part of the meniscus 41. FIG. 5 shows another immersion liquid supply and recovery device 2 in which an extraction chamber 25 is communicated with four sealing extraction channels 26A to 26D. Subject to the regulation by the immersion liquid extraction system 6, it is possible to equalize the pressure at connection points between the four sealing extraction channels 26A to 26D and the extraction chamber 25. The four connection points are evenly distributed in the circumferential direction of the extraction chamber 25, which reduces the maximum distance between the extraction openings 24 and the connection points and improves the consistent load bearing capacity of all extraction openings 24.

The projection objective lens system 1 and the immersion liquid supply and recovery device 2 of the lithography apparatus are stationary, so the substrate 3 needs to move in the exposure process to form a complete integrated circuit pattern on the substrate 3. FIG. 6 shows a traction effect of the substrate 3 in motion on the immersion flow field 4. The substrate 3 moves in the direction from left to right as shown in FIG. 6, and the friction applies a rightward force on the immersion liquid, creating a receding meniscus 41A downstream of the moving direction and an advancing meniscus 41C upstream of the moving direction. The immersion liquid flows mostly to the extraction openings 24A at the receding end, with a small portion flowing to the extraction openings 24C at the advancing end. The movement of the substrate 3 enables the immersion liquid to flow into the four sealing extraction channels 26A to 26D in a form as shown in FIG. 7, with the sealing extraction channel 26A at the receding end bearing a high flow load of the immersion liquid and the sealing extraction channel 26C at the advancing end bearing a low flow load of the immersion liquid. However, when the substrate 3 moves in the opposite direction, the opposite is true for the flow load of the immersion liquid at the both ends.

As a main indicator of the performance of a lithography apparatus, the moving speed of the substrate directly affects the yield of the lithography apparatus. However, when the substrate moves relative to the immersion liquid supply and recovery device, the immersion flow field will be pulled directionally and the load of the sealing extraction channel will be disturbed. The effect of disturbance is evident during the high-speed movement of the substrate, which may lead to the sealing failure of the immersion liquid, the leakage of the immersion liquid, or the change of the flow pattern of the gas-liquid two-phase flow in the immersion liquid extraction channel, resulting in changes in the vibration and heat conduction characteristics of the flow, and ultimately affecting the exposure quality.

SUMMARY OF THE INVENTION

In order to solve the problems that the flow load of a sealing extraction channel of an immersion liquid supply and recovery device is disturbed due to the movement of a substrate in partial immersion lithography, and the sealing, vibration and heat conduction characteristics of the immersion liquid supply and recovery device are deteriorated, an immersion liquid supply and recovery device with novel extraction chambers is provided in the present invention, which makes each of the plurality of extraction chambers always deal with extraction openings under high flow load and low flow load at the same time, by guiding the extraction fluid to flow into extraction openings communicated alternatively with different extraction chambers and further flow into the sealing extraction channels. In this way, the load balancing ability of the immersion liquid extraction chambers and the sealing stability of an immersion flow field are improved, and fluctuations in vibration and heat conduction characteristics caused by changes in the flow pattern of gas-liquid two-phase flow is suppressed, thus improving the exposure quality.

A technical solution employed in the present invention is as follows.

An immersion liquid supply and recovery device with novel extraction chambers is provided, comprising extraction openings, extraction chambers and sealing extraction channels. The extraction chambers are communicated with an immersion flow field through the plurality of extraction openings, and the extraction openings communicated with the different extraction chambers are distributed alternately in the circumferential direction. There are at least two extraction chambers each communicated with an immersion liquid extraction system through one sealing extraction channel.

Preferably, the connection points between the extraction chambers and the sealing extraction channels are evenly distributed in the circumferential direction of the extraction chambers.

Preferably, the extraction openings are evenly distributed in the circumferential direction of the extraction chambers.

Preferably, a section line of each extraction chamber perpendicular to the fluid flow direction in the chamber has a length at least 5 times a diameter of the extraction opening.

Preferably, each extraction opening has a diameter ranging from 0.2 mm to 2 mm.

Preferably, the section line of each extraction chamber perpendicular to the fluid flow direction in the chamber is longer than 2 mm.

Preferably, each extraction chamber is an annular chamber.

Preferably, the connection points between the sealing extraction channels and the extraction chambers are located on a longest chord of the immersion flow field in the moving direction of the substrate.

The beneficial effects of the present invention are as follows.

(1) According to the present invention, the immersion liquid supply and recovery device includes at least two extraction chambers, and the circumferentially distributed extraction openings are alternately communicated with the different extraction chambers which are different in immersion liquid extraction capacity. Under an operating condition that the flow load is disturbed due to the movement of the substrate, each of the extraction chambers always extracts fluid from the extraction openings with high flow loads and low flow loads at the same time, so that the flow load or the gas-liquid ratio of the extracted fluid in the corresponding sealing extraction channels fluctuates less.

(2) Less fluctuation in the flow load or the gas-liquid ratio of the extracted fluid can improve the ability of the extraction openings to confine the meniscus 41 in the immersion flow field and the stability of avoiding the immersion liquid leakage, and stabilize the flow pattern and heat conduction characteristics of the gas-liquid two-phase flow in the sealing extraction channels.

(3) The extraction openings near the connection points between the extraction chambers and the sealing extraction channels have strong load bearing capacity. The connection points of different extraction chambers are disturbed evenly in the circumferential direction, preferably near the extraction openings with high flow load, so that the connection points together can compensate the extraction chambers for the uneven spatial distribution of their extraction capacity to enhance the load balancing capacity of the extraction chambers.

DETAILED DESCRIPTION OF THE INVENTION

Figure 8:
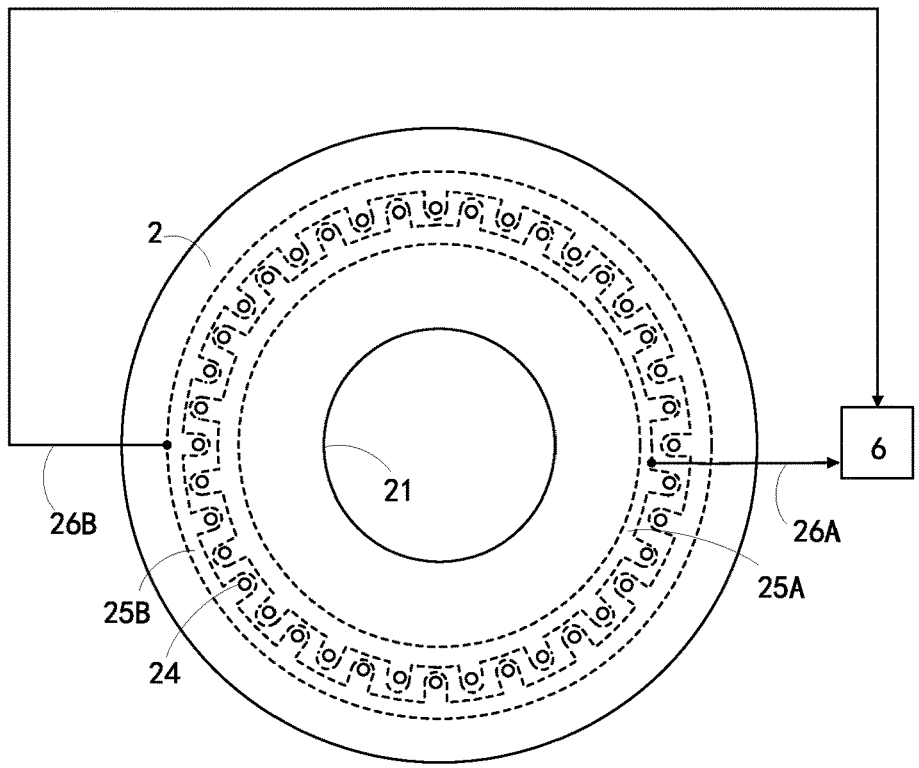
FIG. 8 is a structural diagram according to Embodiment 1 of the present invention.

Embodiment one: As shown in FIG. 8, an immersion liquid supply and recovery device with novel extraction chambers is provided. Two extraction chambers, namely an inner extraction chamber 25A and an outer extraction chamber 25B, are provided in the immersion liquid supply and recovery device 2. A connection point between the inner extraction chamber 25A and an inner sealing extraction chamber 26A is located on the right side of FIG. 8, so extraction openings 24 communicated with the inner extraction chamber 25A have stronger extraction ability when located near the right side and weaker extraction ability when located near the left side. A connection point between the outer extraction chamber 25B and an outer sealing extraction chamber 26B is located on the left side of FIG. 8, so the extraction openings 24 communicated with the outer extraction chamber 25B have stronger extraction ability when located near the left side and weaker extraction ability when located near the right side. Two adjacent extraction openings 24 are communicated with the inner extraction chamber 25A and the outer extraction chamber 25B respectively. Due to the mutual compensation between the inner extraction chamber 25A and the outer extraction chamber 25B, the extraction openings 24 can be considered to have evenly distributed extraction capacity.

Figure 1:
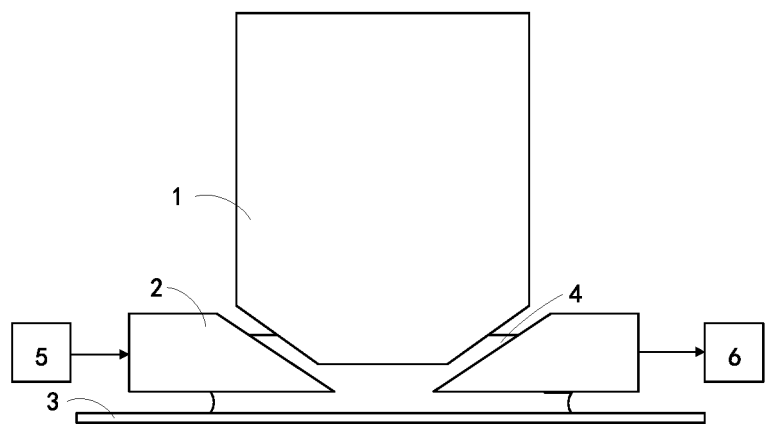
FIG. 1 is a simplified assembly diagram of a device according to the present invention with a projection objective lens system and a substrate.
Figure 2:
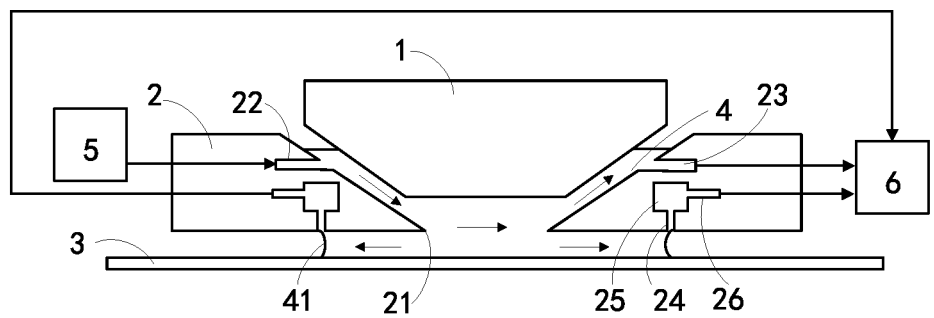
FIG. 2 is a schematic diagram of an immersion liquid supply and recovery device according to the present invention.
Figure 3:
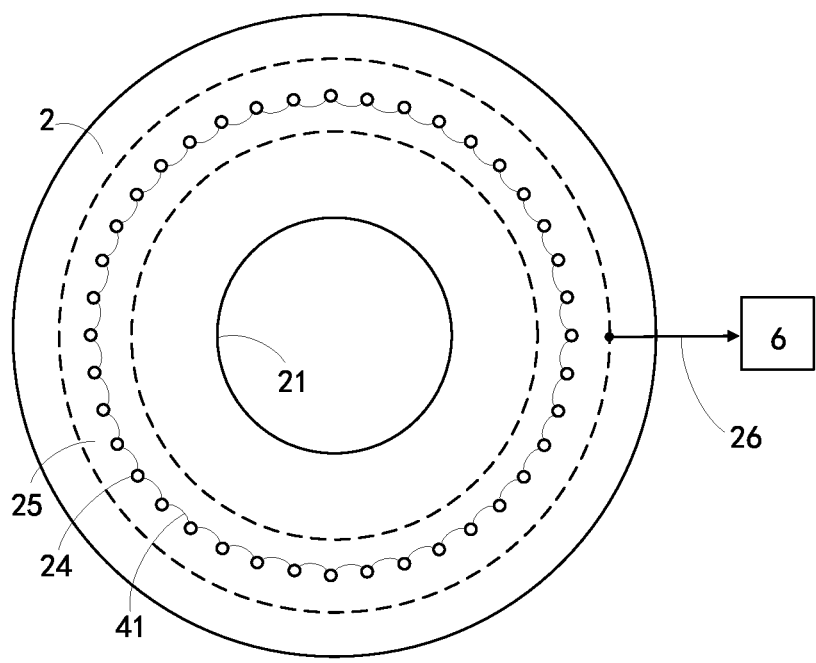
FIG. 3 is a bottom view of FIG. 2.
Figure 4:
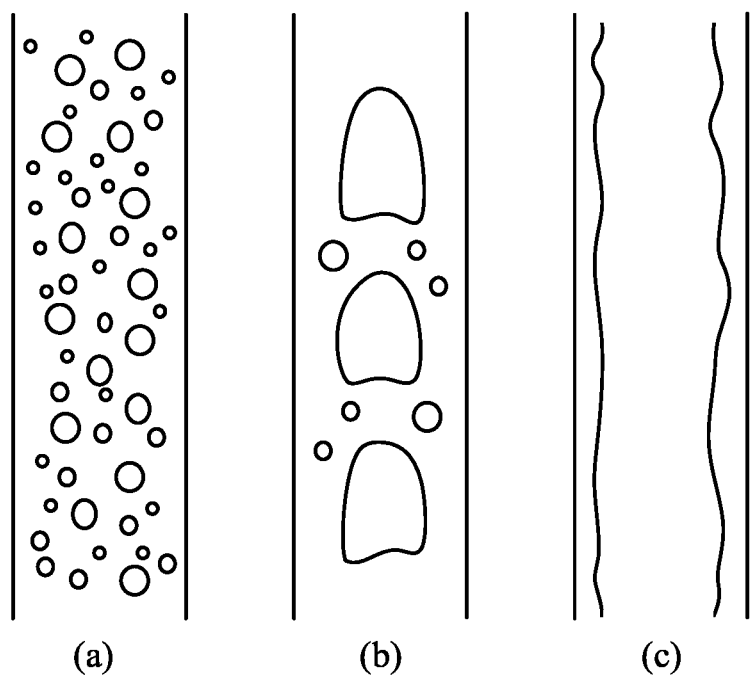
FIG. 4 shows typical flow patterns of gas-liquid two-phase flow in a circular flow channel.
Figure 5:
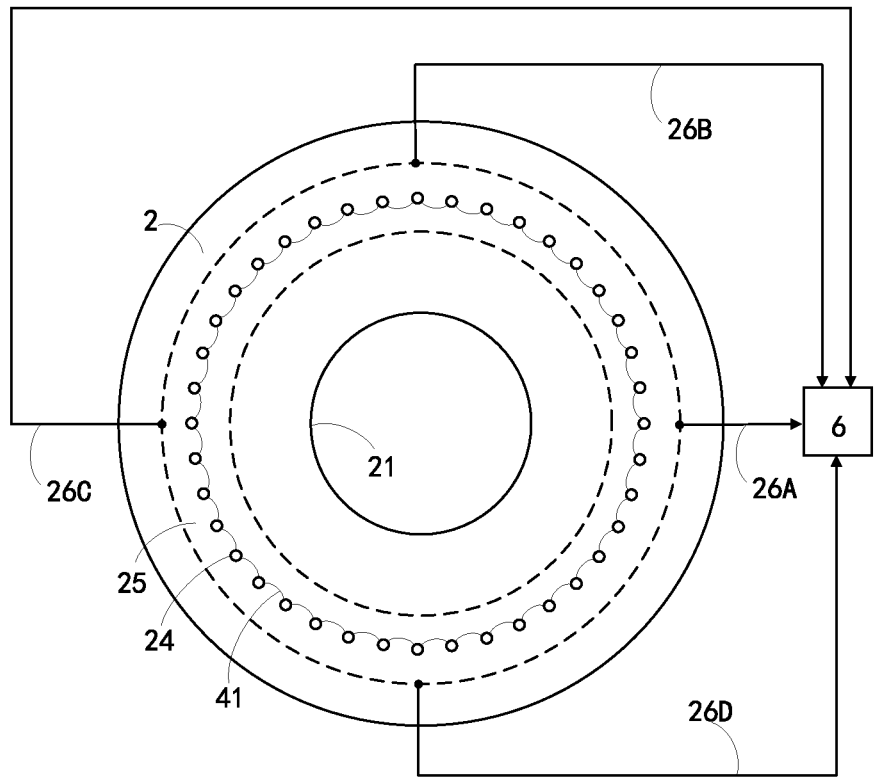
FIG. 5 is a structural diagram of a conventional extraction chamber.
Figure 6:
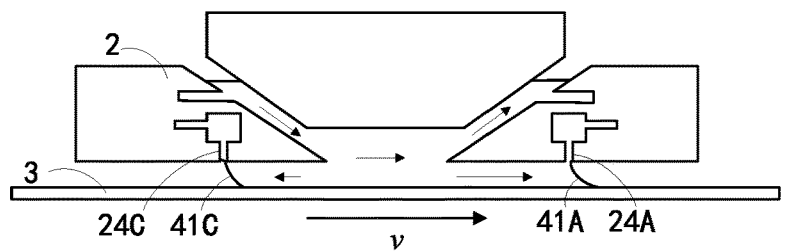
FIG. 6 is a schematic diagram of a traction movement of a substrate.
Figure 7:
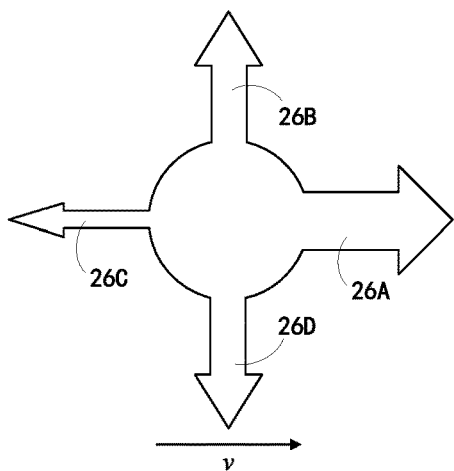
FIG. 7 is a schematic diagram of unbalanced flow loads caused by the traction movement of the substrate.
Figure 9:
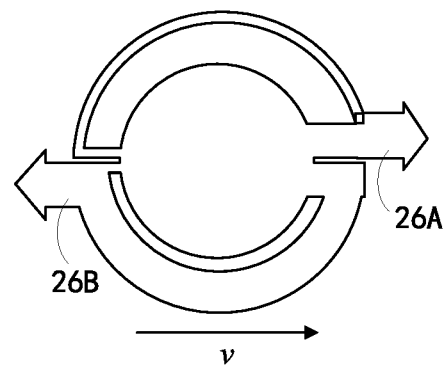
FIG. 9 is a schematic diagram of flow loads under the traction movement of the substrate according to Embodiment 1.

As shown in FIG. 9, when a substrate 3 moves from left to right, the extraction openings 24 on the right side bear higher immersion liquid flow loads, while those on the left side bear lower immersion liquid flow loads. As the extraction openings 24 communicated with the inner extraction chamber 25A and the outer extraction chamber 25B are alternately and evenly distributed, the immersion liquid in the extraction openings 24 with different flow loads is evenly distributed to the inner sealing extraction chamber 26A and the outer sealing extraction chamber 26B. Compared with FIG. 7, a flow load distribution principle shown in FIG. 9 allows better load balancing characteristics when the substrate 3 moves.

In order to reduce the uneven distribution of the extraction capacity of the extraction openings 24, the extraction chamber 25 should have a lower flow resistance than the extraction opening 24. According to the principle that the larger the sectional area of the flow channel, the smaller the flow resistance, in the immersion liquid supply and recovery device 2 according to the present invention, a section line of each extraction chamber perpendicular to the fluid flow direction in the channel has a length at least 5 times of a diameter of the extraction chamber and is longer than 2 mm, so this design can allow a more even distribution of extraction capacity.

Figure 10:
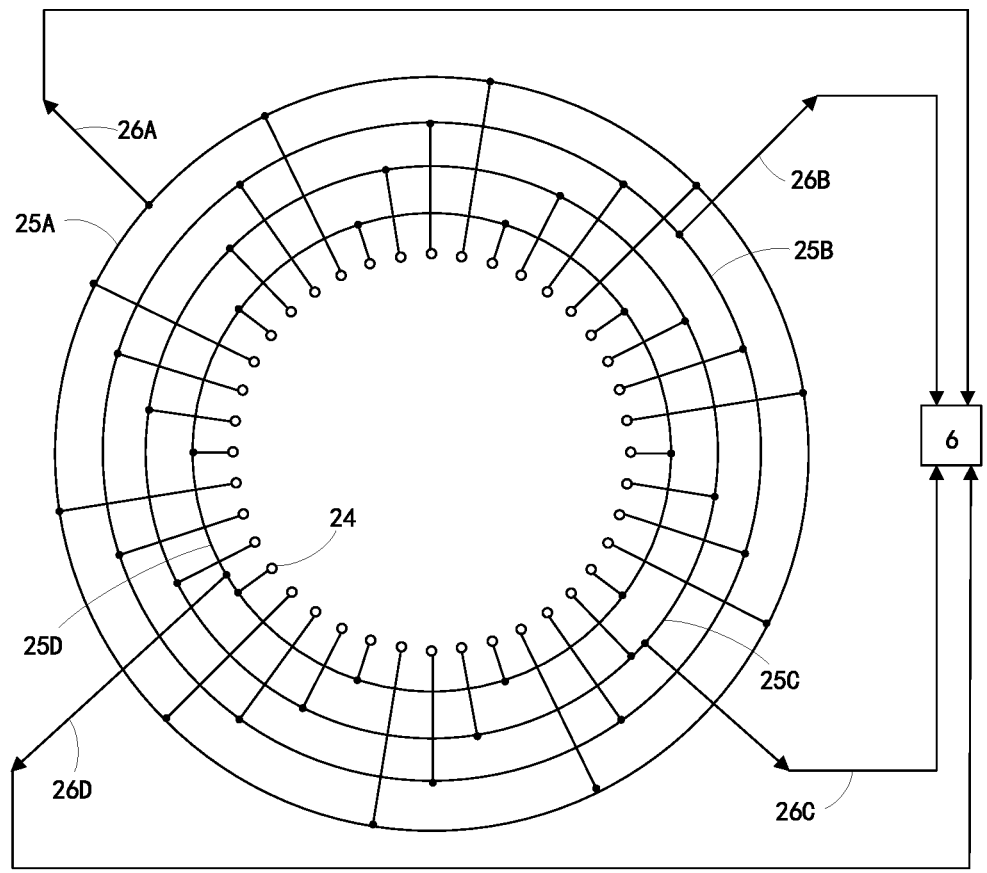
FIG. 10 is a structural diagram according to Embodiment 2 of the present invention.

Embodiment two: As shown in FIG. 10, a method for further improving the even distribution of extraction capacity is to increase the number of sealing extraction channels 26. Four extraction chambers 25A to 25D are provided. Each of the extraction openings 24 communicates with each of the four extraction chambers 25A to 25D in sequence. Connection points between the four extraction chambers 25A to 25D and four sealing extraction channels 26A to 26D are evenly distributed in the circumferential direction of the extraction openings 24. There are fewer extraction openings 24 communicated with each extraction chamber compared with the design of two extraction chambers, so the extraction capacity of the extraction openings 24 is also distributed more evenly.

The connection points between the extraction chambers 25 and the sealing extraction channels 26 should also be distributed in such a way as to adapt to the moving direction of the substrate 3. Because the extraction openings 24 near the connection points have stronger load bearing capacity, it is preferable to distribute the connection points at positions where the flow load of the extracted immersion liquid is high. These positions are generally located on a longest chord of the immersion flow field in the moving direction of the substrate 3. For example, as shown in FIG. 8, when the substrate 3 moves in the horizontal direction, the horizontal diameter of the circular immersion flow field is the longest chord in the moving direction of the substrate 3. The connecting points between the inner sealing extraction channel 26A and the outer sealing extraction channel 26B and the corresponding extraction chambers are distributed at both ends of the diameter, which can better adapt to the horizontal movement of the substrate. In Embodiment 2, the connection points of the four sealing extraction channels 26A to 26D are symmetrically distributed in two diameter directions 45 degrees from the horizontal direction, which can better adapt to the movement of the substrate in two 45 degrees directions.

The above embodiments are not intended to limit but to explain the present invention. Any modifications and variations made to the present invention within the scope of protection defined by the claims of the present invention shall fall into the scope of protection of the present invention.

The invention claimed is:

1. An immersion liquid supply and recovery device, comprising extraction openings, a plurality of extraction chambers and sealing extraction channels, wherein the immersion liquid supply and recovery device is provided between a projection objective lens system and a substrate, a circular through hole through which laser beams pass is formed in a center of the immersion liquid supply and recovery device, the plurality of extraction openings are distributed on a lower end face of the immersion liquid supply and recovery device facing the substrate and along the circumferential direction of the circular through hole, the extraction chambers are communicated with an immersion flow field through the plurality of extraction openings, and the extraction openings communicated with different extraction chambers are distributed alternately along the circumferential direction; and there are at least two extraction chambers each communicated with an immersion liquid extraction system through one sealing extraction channel.

2. The immersion liquid supply and recovery device according to claim 1, wherein connection points between the extraction chambers and the sealing extraction channels are evenly distributed along the circumferential direction of the extraction chambers.

3. The immersion liquid supply and recovery device according to claim 1, wherein the extraction openings are evenly distributed along the circumferential direction of the extraction chambers.

4. The immersion liquid supply and recovery device according to claim 1, wherein a section line of each extraction chamber perpendicular to a fluid flow direction in the extraction chamber has a length at least 5 times of a diameter of the extraction opening.

5. The immersion liquid supply and recovery device according to claim 1, wherein each extraction opening has a diameter ranging from 0.2 mm to 2 mm.

6. The immersion liquid supply and recovery device according to claim 1, wherein the section line of each extraction chamber perpendicular to the fluid flow direction in the extraction chamber is longer than 2 mm.

7. The immersion liquid supply and recovery device according to claim 1, wherein each extraction chamber is an annular channel.

8. The immersion liquid supply and recovery device according to claim 1, wherein the connection points between the sealing extraction channels and the extraction chambers are respectively located on either end of a diameter that represents the longest chord of the immersion flow field that is circular shaped in the moving direction of the substrate.

9. The immersion liquid supply and recovery device according to claim 2, wherein each extraction opening has a diameter ranging from 0.2 mm to 2 mm.

10. The immersion liquid supply and recovery device according to claim 3, wherein each extraction opening has a diameter ranging from 0.2 mm to 2 mm.

11. The immersion liquid supply and recovery device according to claim 2, wherein the section line of each extraction chamber perpendicular to the fluid flow direction in the extraction chamber is longer than 2 mm.

12. The immersion liquid supply and recovery device according to claim 3, wherein the section line of each extraction chamber perpendicular to the fluid flow direction in the extraction chamber is longer than 2 mm.

* * * * *